United States Patent [19]

Takahashi et al.

[11] Patent Number: 5,201,452
[45] Date of Patent: Apr. 13, 1993

[54] SCREEN PRINTING APPARATUS

[75] Inventors: Ken Takahashi, Kofu; Takao Naito; Hiroyuki Miyake, both of Yamanashi; Takashi Sasaki, Kofu, all of Japan

[73] Assignee: Matsushita Electric Industrial Co., Ltd., Kadoma, Japan

[21] Appl. No.: 917,979

[22] Filed: Jul. 24, 1992

[51] Int. Cl.$^5$ ................. B23K 31/02; B23K 37/00
[52] U.S. Cl. ........................... 228/8; 228/41; 228/248; 101/114
[58] Field of Search ............ 228/102, 245, 248, 8, 228/33, 41; 101/114, 129; 222/52

[56] References Cited

U.S. PATENT DOCUMENTS 4,784,310 11/1988 Metzger et al. .................. 228/187
4,942,998 7/1990 Horvath et al. .................. 228/248

Primary Examiner—Samuel M. Heinrich
Attorney, Agent, or Firm—Wenderoth, Lind & Ponack

[57] ABSTRACT

A screen printing apparatus includes a stage for positioning a substrate thereto, a screen plate positioned above the stage, a squeegee, positioned above the screen plate, for printing material to be printed on the substrate, an adjusting means for adjusting a movement range of the squeegee with respect to the substrate, a surface state-recognizing means for recognizing a surface state of the screen plate after the material is printed on the substrate, and a control means for processing information obtained by the surface-recognizing means and operating the adjusting means so as to adjust the movement range of the squeegee to the substrate.

8 Claims, 4 Drawing Sheets

SCREEN PRINTING APPARATUS

BACKGROUND OF THE INVENTION

The present invention relates to a screen printing apparatus for printing with high accuracy cream solder or paste used for forming a thick-film circuit on a substrate on which an electronic circuit is formed.

With the recent miniaturization of electronic appliances, normally, electronic components such as chip components are mounted on cream solder which has been printed on a substrate and then a reflowing oven is used to solder it to the cream solder.

The constructions of conventional screen printing apparatuses for printing paste such as cream solder on the substrate are described below with reference to FIGS. 3 through 5.

The construction of a first conventional screen printing apparatus is described below with reference to FIG. 3. A substrate 51 is positioned onto a stage 52. Then, a lower cylinder 53 moves the stage 52 upward so that the substrate 51 is positioned at a level immediately below a screen plate 55 fixed to a screen frame 54. Thereafter, a squeegee 56 is moved downward by a head cylinder 57 and the squeegee 56 is then stopped by a stopper 58. As a result of the horizontal movement of a printing head 59, paste 60 such as cream solder is printed on the substrate 51. Upon completion of the printing, the lower cylinder 53 moves the stage 52 downward and the head cylinder 57 moves the squeegee 56 upward.

In the first conventional screen printing apparatus, the lower limit of the squeegee 56 is determined by the stopper 58. Therefore, in order to select the most suitable printing condition, it is necessary for an operator to adjust the position of the stopper 58 by visually observing the surface state of the screen plate 55 and the printing state of the substrate 51 after printing is completed. Accordingly, printing state is varied depending on an operator, a substrate, or the period of time in which the paste 60 is exposed to air.

In addition, with the recent miniaturization of electronic appliances, the substrate on which electronic components are mounted is becoming smaller and finer. In this trend, there are growing demands for the development of screen printing apparatuses capable of not only accomplishing a favorable printing performance, but also having a mechanism for replacing a substrate-positioning stage in a short period of time.

The construction of a second conventional screen printing apparatus is described below with reference to FIG. 4. A substrate 62 transported by a transporting link 61 is positioned on the upper surface of a stage 63. A negative pressure-sucking means is employed to position the substrate 62 on the stage 63. Simultaneously with the upward movement of the stage 63 made by a cylinder 64, a protecting plate 65 is pressed upward by rods 66. Paste disposed on a screen 67 is printed on the substrate 62 with the upper surface of the substrate 62 and that of the protecting plate 65 moved upward to the flat lower surface of the screen 67.

In the construction of the second conventional screen printing apparatus, it is necessary to manufacture the stages 63 which is equipped with the substrate-sucking means and accords to the outer dimension of each substrate 62. Therefore, the manufacturing cost of this apparatus is high.

In addition, a factory requiring the stages 63 of various sizes may have a trouble that the stage 63 is not ready for a day when printing operation starts. Moreover, while the stage 63 is being replaced, the operation of the screen printing apparatus has to be stopped for a long time.

The construction of a third conventional screen printing apparatus is described below with reference to FIG. 5. A substrate 71 is supported by support pins 70 inserted into holes 69 of a stage 68 and a cylinder 72 moves horizontally presses rollers 73 against the periphery of the substrate 71 so that the substrate 71 is positioned on the stage 68. Then, a cylinder 74 moves the substrate 71 so that the substrate 71 is positioned at a level in the vicinity of the lower surface of a screen 75 and then paste 76 placed on the screen 75 is printed on the substrate 71 with a squeegee 77 which moves horizontally sweeping the paste 76.

In the construction of the third conventional screen printing apparatus, the selected support pins 70 are inserted into the holes 69 of the stage 68 according to the outer dimension of the substrate 71. Therefore, it is unnecessary to manufacture the stages 68 of various sizes unlike the second conventional screen printing apparatus. The operation efficiency of the screen printing apparatus is favorable in this respect. But it takes much time and labor to insert the support pins 70 into the holes 69 of the stage 68 if the paste 76 is to be printed on both surfaces of the substrate 71. That is, it is necessary for an operator to selectively insert the support pins 70 into the holes 69 of the stage 68 in the screen printing apparatus so that the support pins 70 do not contact electronic components mounted on either the front surface of the substrate 71 or the back surface thereof.

SUMMARY OF THE INVENTION

It is an object of the present invention to provide a screen printing apparatus capable of printing paste such as cream solder on a substrate in a uniform thickness.

It is another object of the present invention to provide a screen printing apparatus capable of printing paste such as cream solder on a substrate in a uniform thickness and capable of replacing a substrate-positioning plate efficiently without skill.

In accomplishing these and other objects, according to one aspect of the present invention, there is provided a screen printing apparatus comprising:

a stage for positioning a substrate thereto;

a screen plate positioned above the stage;

a squeegee, positioned above the screen plate, for printing material to be printed on the substrate;

an adjusting means for adjusting a movement range of the squeegee with respect to the substrate;

a surface state-recognizing means for recognizing a surface state of the screen plate after the material is printed on the substrate; and a control means for processing information obtained by the surface-recognizing means and operating the adjusting means so as to adjust the movement range of the squeegee to the substrate.

According to the above-described construction, the surface state-recognizing means detects the amount of the material to be printed such as paste placed on the screen plate after printing is completed, and the control means controls the movement range of the squeegee with respect to the substrate. Then, the paste can be automatically placed in an any desired amount on the screen. Thus, the paste can be printed on the substrate in a uniform thickness independently of an operator, a substrate, or the period of time in which the paste is exposed to air.

According to another aspect of the present invention, there is provided the screen printing apparatus further comprising:

a driving means for vertically moving the stage in a desired level;

a replaceable plate, removable from the stage, placed in position on the stage by the positioning pins;

a positing means for positioning the replaceable plate on the stage; and a plurality of support pins, removably inserted into a plurality of inserting holes formed on the replaceable plate, for supporting the substrate.

Owing to the replaceable plate, during the printing operation of the preceding substrate, the support pins can be selectively used in advance of printing according to the size of the substrate on which the paste is printed subsequently. Therefore, in printing the paste on the substrate of a different size or thickness, skill is not required for the operator but positioning the replaceable plate on the stage by means of the positioning pins is only required.

Further, the support pins can be selectively used according to the size of the substrate. Accordingly, there is no need of manufacturing substrate-positioning the stage equipped with a substrate-sucking circuit and replacing it unlike the conventional screen printing apparatus. Thus, the operation of the screen printing apparatus is suspended only a short period of time in exchanging the replaceable plate and in addition, the apparatus can be manufactured at a low cost.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE INVENTION

Figure 1:
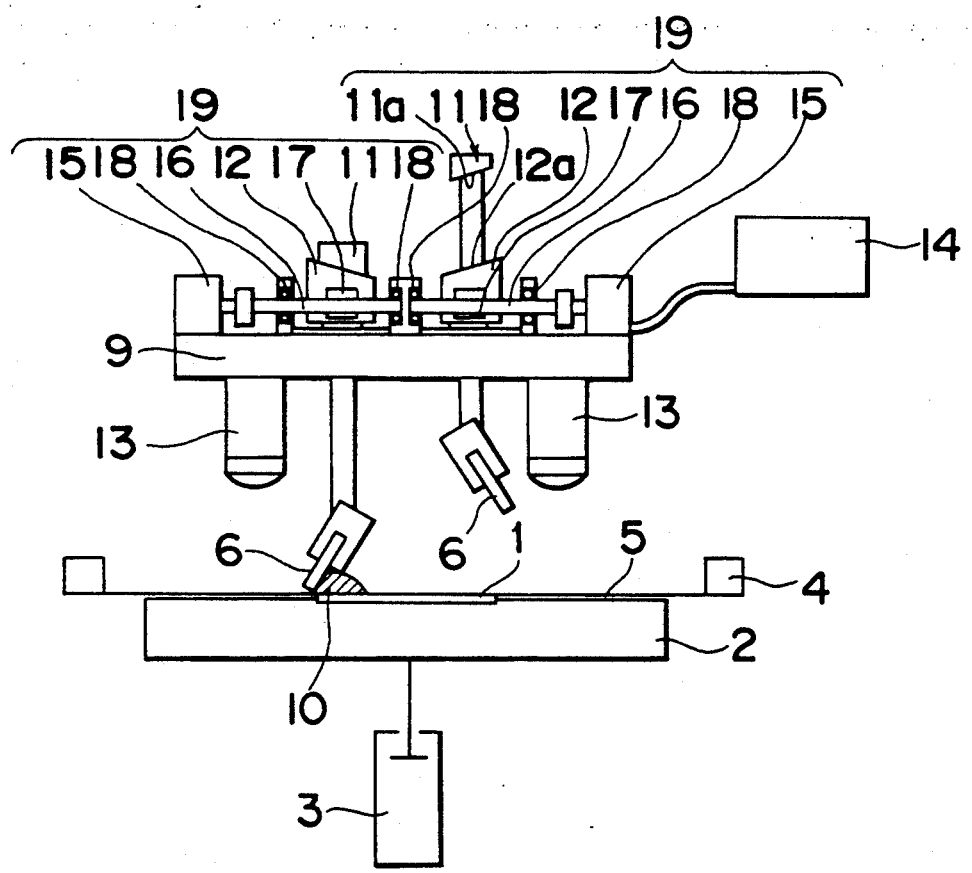
FIG. 1 is a schematic front view showing a screen printing apparatus according to an embodiment of the present invention.

Before the description of the present invention proceeds, it is to be noted that like parts are designated by like reference numerals throughout the accompanying drawings.

A screen printing apparatus according to an embodiment of the present invention is described below with reference to FIG. 1 which is a schematic front view showing the construction of the screen printing apparatus. The screen printing apparatus comprises a stage 2 driven to vertically move by a lower cylinder 3; a screen plate 5 supported by a screen frame 4; squeegees 6 driven to vertically move by a head cylinder (not shown); a control section 14; and a printing head 9 having the two lower limit-adjusting sections 19 at its upper surface and two surface state-recognizing sections 13 including cameras at its lower surface.

Each lower limit-adjusting section 19 for adjusting the operation of each squeegee 6 comprises a ball thread 16 for moving a wedge-shaped block 12; a slide guide 17 for guiding the horizontal movement of the block 12 on the upper surface of the printing head 9; and bearings 18 for rotatably supporting the ball thread 16, in addition to the block 12; a stopper 11 of the vertical movement of the squeegee 6; and a pulse motor 15 connected with one end of the ball thread 16 to rotate the ball thread 16.

An inclined surface 12a is formed on the upper surface of the wedge-shaped block 12 and an inclined surface 11a corresponding to the inclined surface 12a is formed on the lower surface of the stopper 11. The movement of the stopper 11 is regulated by the block 12 as a result of the contact between the inclined surface 11a of the stopper 11 and the inclined surface 12a of the block 12. As a result of the movement of the block 12 made by the rotation of the ball thread 16, the area of the contact surface between the inclined surfaces 11a and 12a is varied, with the result that the lower limit of the stopper 11 is adjusted.

In operation, first, a substrate 1 is fixedly positioned onto the stage 2 and then, moved upward by the lower cylinder 3 to be positioned at a level immediately below the screen plate 5 fixed to the screen frame 4. Thereafter, the squeegee 6 is moved downward by a head cylinder not shown and stopped when the stopper 11 is stopped by the block 12. Then, as a result of the horizontal movement of the printing head 9, cream solder 10 is printed on the substrate 1 by the squeegee 6. Then, the surface state-recognizing section 13 recognizes the surface state of the screen plate 5 after the movement of the squeegee 6. That is, if the cream solder 10 is left on the screen plate 5 at not less than 3% of the visual field recognized by the surface state-recognizing section 13, the pulse motor 15 is actuated in response to a signal outputted from the control section 14. As a result, the block 12 moves toward the outer side of the ball thread along the axis thereof, thus lowering the lower limit of the stopper 11 and consequently, the lower limit of the squeegee 6 is lowered. In this manner, the amount of the cream solder 10 which remains on the screen plate 5 becomes smaller than 3%. If the cream solder 10 is left on the screen plate 5 at not more than 1% of the visual field recognized by the surface state-recognizing section 13, the pulse motor 15 is actuated in response to a signal outputted from the control section 14. As a result, the block 12 moves toward the inner side of the ball thread along the axis thereof, thus making the lower limit of the stopper 11 higher and consequently, the lower limit of the squeegee 6 is made to be higher. In this manner, the amount of the cream solder 10 which remains on the screen plate 5 becomes greater than 1%. This operation is repeated until the cream solder 10 is left on the screen plate at 1% to 3% of the visual field recognized by the surface state-recognizing section 13.

Owing to the above-described construction, the surface state-recognizing section 13 detects the amount of the cream solder 10 placed on the screen plate 5 after printing is completed, and the control section 14 controls the lower limit of the squeegee 6. As a result, the amount of the cream solder 10 can be automatically set to any desired percentage between a state where the cream solder 10 is not completely left on the screen plate 5 and a state where the cream solder 10 is slightly left on it, e.g. 1% to 3% of the visual field recognized by the surface state-recognizing section 13. Thus, the cream solder 10 can be printed on the substrate 1 in a uniform thickness independently of an operator, a substrate, or the period of time in which the cream solder 10 is exposed to air.

Figure 2:
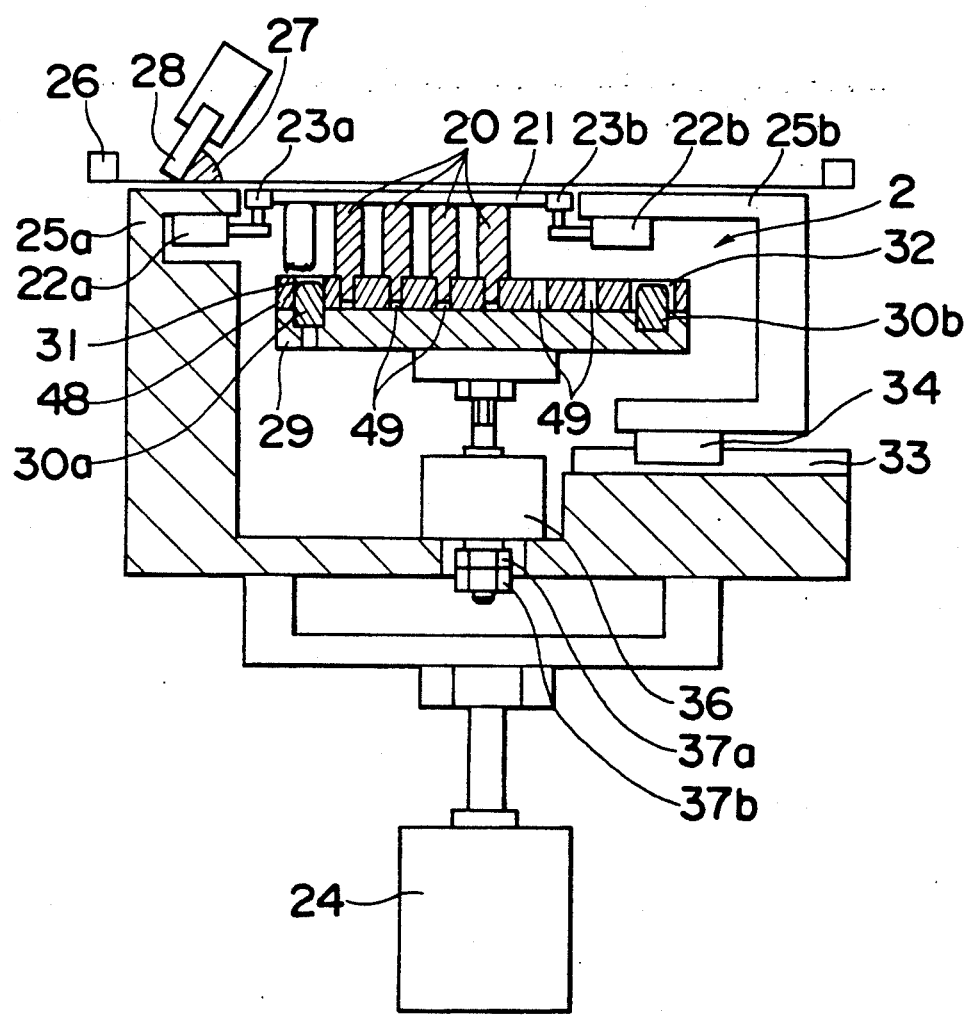
FIG. 2 is a partially cut-away front view showing a screen printing apparatus according to another embodiment of the present invention.
Figure 3:
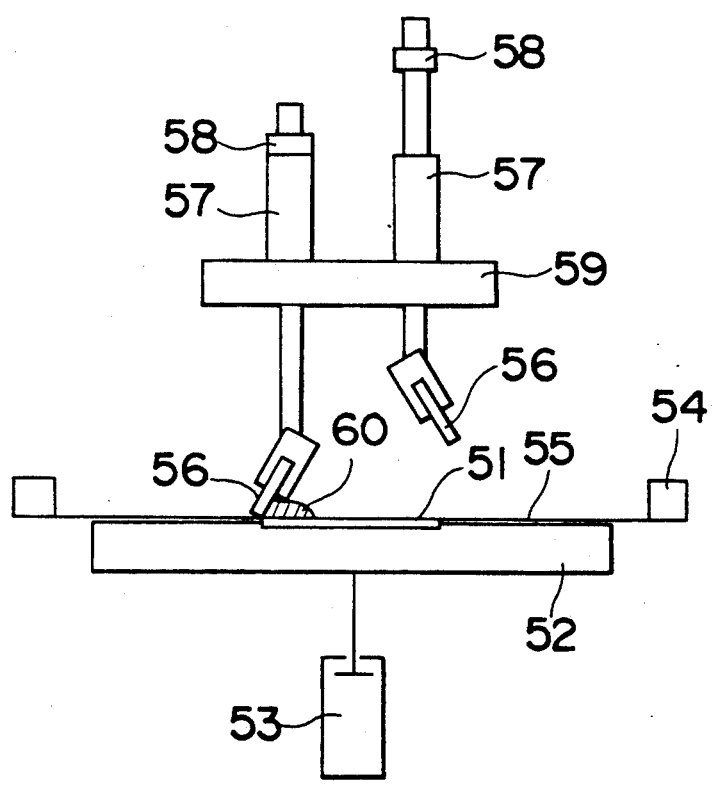
FIG. 3 is a schematic front view showing a conventional screen printing apparatus.
Figure 4:
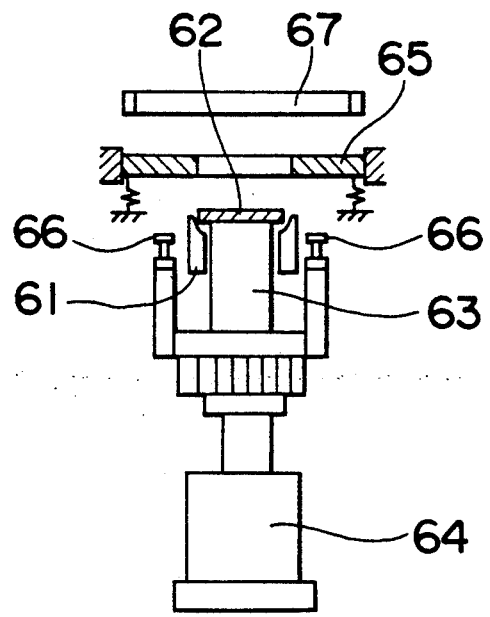
FIG. 4 is a partially cut-away front view showing another conventional screen printing apparatus.
Figure 5:
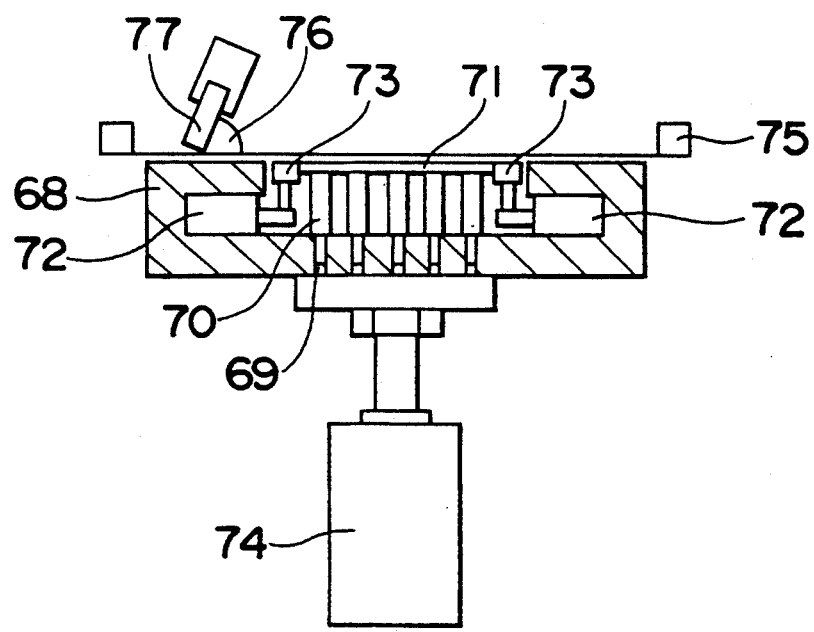
FIG. 5 is a front view showing still another conventional screen printing apparatus.

A screen printing apparatus according another embodiment is described below with reference to FIG. 2. An object 21 to be printed such as substrate is supported by a plurality of support pins 20 each removably inserted into each hole 49 of a replaceable plate 48 capable of preparing outside and sandwiched between a pair of rollers 23a and 23b pressed against the periphery of the substrate 21. The rollers 23a and 23b are installed on the leading end of a pair of cylinders 22a and 22b arranged at a pair of stages 25a and 25b, respectively. In this manner, the substrate 21 is fixedly positioned to the stages 25a and 25b. A cylinder 24 moves the stages 25a and 25b upward so that the substrate 21 is moved upward to be disposed at a level in the vicinity of the lower surface of a screen 26. Then, paste 27 placed on the screen 26 is printed on the substrate 21 with the paste 27 being swept by a squeegee 28 moving horizontally. Upon completion of the printing, the cylinder 24 moves the stages 25a and 25b holding the substrate 21 downward.

The replaceable plate 48 is positioned onto a stage 29 by inserting pins 30a and 30b projecting from both ends of the stage 29 into a hole 31 formed on one end of the replaceable plate 48 and an elongated hole 32 formed on the other end thereof, respectively.

Preferably, at least one replaceable plate 48 is prepared in addition to the replaceable plate 48 mounted on the screen printing apparatus so that the support pins 20 necessary to support a subsequent substrate 21 are selectively inserted into the holes 49 in advance of printing.

In printing the paste 27 on the substrate 21 of a different size, the moving stage 25b installed on a slider 34 is moved on a rail 33 according to the size of the substrate 21 through the slider 34, and the replaceable plate 48 having the support pins 20 previously inserted into the holes 49 thereof according to the size of the substrate 21 is installed on the stage 29 by inserting the inserting pins 30a and 30b of the stage 29 into the holes 31 and 32 of the replaceable plate 48.

In printing the paste 27 on the substrate 21 of a different thickness, the upper limit of the stroke of a cylinder 36 which moves the stage 29 vertically is adjusted by nuts 37a and 37b.

According to the embodiment described above, the replaceable plate 48 having the support pins 20 inserted into the holes 49 thereof can be removably installed on the stage 29 by previously inserting the inserting pins 30a and 30b of the stage 29 into the holes 31 and 32 of the replaceable plate 48. Therefore, during the printing operation of a preceding substrate 21, the support pins 20 can be selectively inserted into the holes 49 in advance of printing according to the size of a substrate 21 on which the paste 27 is subsequently printed. That is, in printing the paste 27 on the substrate 21 of a different size or thickness, skill is not required for the operator but positioning the replaceable plate 48 on the stage 26 by means of the inserting pins 30a and 30b is only required. Then, in replacing the replaceable table 48 for the substrate 21 of a different size or thickness, the operation of the screen printing apparatus is suspended only a short period of time. And when both of the surfaces of the substrate are printed, it is necessary for an operator to selectively insert the support pins 70 into the holes 69 of the stage 68 so that the support pins 70 do not contact electronic components mounted on either the front surface of the substrate 71 or the back surface thereof Such an operation can be performed outside the screen printing apparatus during the preceding substrate is printed in the apparatus, thus resulting in shorter period of time for replacing the substrate. Furthermore, since the support pins 20 are selectively inserted into the holes 49 according to the size of the substrate 21, it is unnecessary to manufacture stages of various sizes according to the size of the substrate 21. Further, the support pins 20 can be selectively used according to the size of the substrate 21. As a result, when the substrate 21 having difference size and thickness is used, there is no need of manufacturing substrate-positioning stages equipped with a substrate-sucking circuit and replacing them unlike the conventional screen printing apparatus. Thus, the operation of the screen printing apparatus is suspended only a short period of time in exchanging the replaceable plate and in addition, the apparatus can be manufactured at a low cost because of no-need of manufacturing substrate-positioning stages.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A screen printing apparatus comprising:
   a stage for positioning a substrate thereto;
   a screen plate positioned above the stage;
   a squeegee, positioned above the screen plate, for printing material to be printed on the substrate;
   an adjusting means for adjusting a movement range of the squeegee with respect to the substrate;
   a surface state-recognizing means for recognizing a surface state of the screen plate after the material is printed on the substrate; and
   a control means for processing information obtained by the surface-recognizing means and operating the adjusting means so as to adjust the movement range of the squeegee to the substrate.

2. The screen printing apparatus as claimed in claim 1, wherein the adjusting means comprises:
   a block having an inclined surface and moving in a direction, which intersects a direction for moving the squeegee, so that the movement range of the squeegee is adjusted with respect to the substrate; and
   a stopper having an inclined surface for coming in contact with the inclined surface of the block so as to adjust the movement range of the squeegee.

3. The screen printing apparatus as claimed in claim 1, further comprising:
   a driving means for vertically moving the stage in a desired level;
   a replaceable plate, removable from the stage, placed in position on the stage by the positioning pins;
   a positing means for positioning the replaceable plate on the stage; and
   a plurality of support pins, removably inserted into a plurality of inserting holes formed on the replaceable plate, for supporting the substrate.

4. The screen printing apparatus as claimed in claim 1, further comprising a plurality of holding means for holding a periphery of the substrate supported by the supporting pins, each of the holding means having a roller for holding the periphery of the substrate and a driving means for moving the roller with respect to the substrate.

5. The screen printing apparatus as claimed in claim 4, wherein one of the driving means of the holding means is movable to the other of the driving means of the holding means.

6. The screen printing apparatus as claimed in claim wherein the positioning means has a plurality of positing pins formed on the stage and inserting in holes formed on the replaceable plate.

7. A screen printing apparatus comprising:
a stage for positioning a substrate thereto;
a screen plate positioned above the stage;
a squeegee, positioned above the screen plate, for printing material to be printed on the substrate;
a adjusting means for adjusting a movement range of the squeegee with respect to the substrate, the adjusting means including a block having an inclined surface and moving in a direction, which intersects a direction for moving the squeegee, so that the movement range of the squeegee is adjusted with respect to the substrate, and a stopper having an inclined surface for coming in contact with the inclined surface of the block so as to adjust the movement range of the squeegee;
a surface state-recognizing means for recognizing a surface state of the screen plate after the material is printed on the substrate;
a control means for processing information obtained by the surface-recognizing means and operating the adjusting means so as to adjust the movement range of the squeegee to the substrate;
a driving means for vertically moving the stage in a desired level;
a replaceable plate, removable from the stage, placed in position on the stage by the positioning pins;
a positing means for positioning the replaceable plate on the stage; and
a plurality of support pins, removably inserted into a plurality of inserting holes formed on the replaceable plate, for supporting the substrate.

8. The screen printing apparatus as claimed in claim 7, further comprising a plurality of holding means for holding a periphery of the substrate supported by the supporting pins, each of the holding means having a roller for holding the periphery of the substrate and a driving means for moving the roller with respect to the substrate, one of the driving means of the holding means being movable to the other of the driving means of the holding means,
wherein the positioning means has a plurality of positing pins formed on the stage and inserting in holes formed on the replaceable plate.

* * * * *